United States Patent [19]
Sim et al.

[11] Patent Number: 5,933,708
[45] Date of Patent: Aug. 3, 1999

[54] LEAD-ON-CHIP SEMICONDUCTOR PACKAGE AND METHOD FOR MAKING THE SAME

[75] Inventors: Sung Min Sim, Suwon; Young Hee Song, Seongnam; Young Do Kweon, Seoul; Hai Jeong Sohn, Suwon, all of Rep. of Korea

[73] Assignee: Samsung Electronics, Co., Ltd., Kyungki-do, Rep. of Korea

[21] Appl. No.: 08/843,931

[22] Filed: Apr. 17, 1997

[30] Foreign Application Priority Data

Apr. 18, 1996 [KR] Rep. of Korea ............... 96/11812

[51] Int. Cl.$^6$ ............ H01L 21/44; H01L 21/48; H01L 21/50
[52] U.S. Cl. ............................. 438/118; 438/123
[58] Field of Search .................... 438/118, 123, 438/FOR 377, FOR 380, 106; 257/666, 668, 676

[56] References Cited

U.S. PATENT DOCUMENTS 5,286,679  2/1994  Farnworth et al. ............. 437/209

*Primary Examiner*—Jey Tsai
*Assistant Examiner*—David A. Zarneke
*Attorney, Agent, or Firm*—Marger Johnson & McCollom, P.C.

[57] ABSTRACT

A method for bonding a semiconductor chip to a lead frame in a LOC type semiconductor package in which a plurality of inner leads are bonded to an active surface of the semiconductor chip. A semiconductor chip is prepared with a partially-cured polyimide layer on the active surface. One or more strips of polyimide tape is attached to the inner leads. The semiconductor chip is attached to the inner leads by making an intermediate pressure bond between the polyimide tape and the partially-cured polyimide coating layer on the active surface. The polyimide coating layer is then cured.

14 Claims, 3 Drawing Sheets

1

LEAD-ON-CHIP SEMICONDUCTOR PACKAGE AND METHOD FOR MAKING THE SAME

BACKGROUND OF THE INVENTION

1. Field of the Invention

The present invention relates generally to a lead-on-chip LOC semiconductor package and to a method for manufacturing such a package, and more particularly, it relates to a method for bonding a semiconductor chip to a lead frame in LOC type semiconductor packages using partially-cured polyimide.

2. Description of the Related Art

The electronic industry continues to develop more compact semiconductor packages to keep pace with the trend toward reduction in size and weight of electronic products and appliances. However, surface mount packages using a lead frame to support semiconductor chips as well as to provide an electrical connection between the chips and external systems have an inherent limitation on size reduction, namely a space which corresponds to the thickness of the lead frame that should be provided between the die pads and the leads. Therefore, in practice, the maximum size of a chip which can be mounted in a package is about 70% of the width of the package.

To avoid this limitation, new chip mount technologies have been proposed. Among others, one example is LOC technology in which a chip is directly attached to leads.

A conventional LOC type semiconductor package is depicted in FIGS. 1 and 2. FIG. 1 is a plan view showing a conventional LOC type semiconductor chip package device; and FIG. 2 is a cross-sectional view depicting the bonding of a semiconductor chip to a lead frame according to one embodiment of a conventional LOC type semiconductor package.

With reference to FIG. 1, a LOC type semiconductor package 100 includes a chip 10 attached to the lower surface of leads 22 of a lead frame 20 by way of a double-sided adhesive polyimide tape 60 interposed therebetween. Bonding pads 12 on the chip 10 are electrically connected to respective corresponding leads 22 through gold wires 30. The leads 22, the chip 10, tie bars 24 and the electrical connections are encapsulated with a molding resin to provide a package body 40.

A double-sided adhesive tape 60 includes a polyimide tape 62 with an adhesive 64, 66 on both sides. The double-sided adhesive polyimide tape 60 is bonded to the lower surface of the leads 22 on one side thereof and is bonded to the upper surface of the chip 10 on the other side thereby attaching the chip 10 to the leads 22 via the tape 60.

An advantage of using a double-sided adhesive polyimide tape in fabricating LOC type semiconductor packages is that the tape can absorb stress when the chip 10, lead frame 22 and tape 60 are assembled as shown in FIG. 2 and compressed using a press during to bond the lead frame 22 to the chip 10 during the manufacturing process. The chip 10 has a polyimide coating 50 on its upper surface to prevent chip 10 from being damaged when the lead frame is bonded to the chip.

The double-sided adhesive polyimide tape 60 is not easy to handle since it is adhesive on both sides. It is also expensive. Moreover, since the number of interfaces in the package device increases, package failures such as cracks or a debonding between the interfaces may increase, resulting in a reduction in package reliability.

To address some of the problems associated with adhesive tape, chip 10 was coated with polyimide coating 50 and directly bonded to leads 22 using an adhesive 70 as shown in FIG. 3. In this case, however, a greater stress is applied on the chip 10 during the bonding process than the case where a double-sided adhesive tape is used, resulting in a higher possibility of causing damage to chip 10.

Therefore, there has been a need to provide a method for bonding a semiconductor chip to a lead frame in an LOC type semiconductor package which allows a reduction of the number of interfaces and of the stress applied on the chip, and a curtailment of the production cost.

SUMMARY OF THE INVENTION

Thus, an object of the invention is to provide a new method for bonding a semiconductor chip to a lead frame in a LOC type semiconductor package.

The object can be accomplished by a method in which a plurality of inner leads are bonded to an active surface of the semiconductor chip having a partially-cured polyimide coating layer on the active surface. To accomplish this result, one or more strips of polyimide tape are attached to the inner leads. The semiconductor chip is attached to the inner leads by making an intermediate bond between the polyimide tape and the partially-cured polyimide coating layer on said active surface by pressure. Thereafter, the semiconductor chip is bonded to the inner leads firmly by completing the curing of the polyimide coating layer.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to accompanying drawings.

Figure 4:
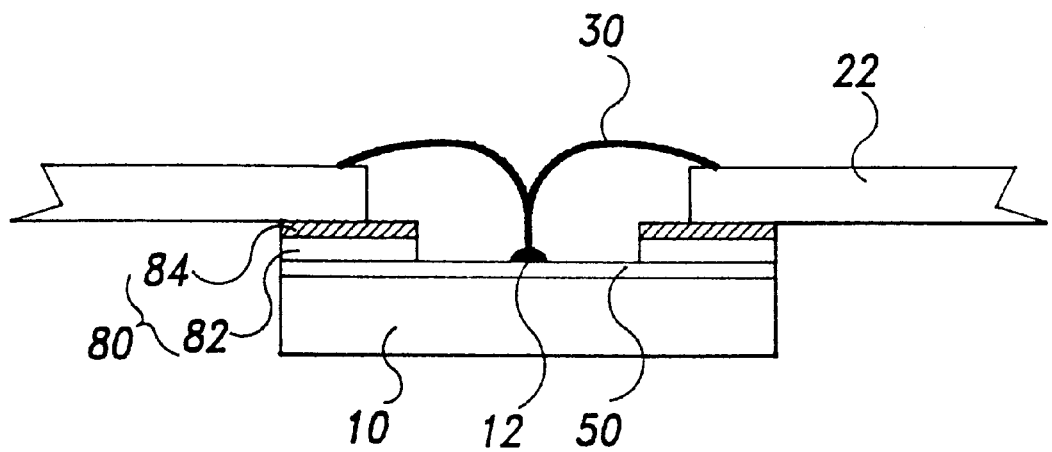
FIG. 4 is a cross-sectional view depicting the bonding of a semiconductor chip to a lead frame according to one embodiment of the inventive LOC type semiconductor package.

FIG. 4 is a cross-sectional view depicting the bonding of a semiconductor chip to a lead frame according to one embodiment of the inventive LOC type semiconductor package. A single-sided adhesive polyimide tape 80 includes a polyimide film 82 and an adhesive layer 84 coated onto the upper surface of the film 82. The lower surface of the film 82 where there is no adhesive layer, is fixed to polyimide coating 50 on the surface of the chip 10. The bonding pads 12 on the upper surface of the chip 10 are connected to leads 22 such as by bonding using gold wire 30.

The LOC type semiconductor package device having the structure described above can be manufactured by the following process. With reference to FIG. 4, a semiconductor chip 10 with a partially-cured polyimide coating 50 on its upper surface is prepared. The polyimide coating 50 may be formed during wafer preparation by applying a polyimide solution on the upper surface of the chip and incompletely curing it. The term partially-cured as used herein means that about 90% or less of imidization of the curing reaction to form the polyimide occurs. This can be accomplished by curing the polyimide solution in situ on the upper surface of the chip at a temperature of 200–250° C. for about 0.5–1 hour to vaporize the solvent so that the partially-cured polyimide acts as an adhesive upon heating or pressing. If the curing step is carried out at a temperature above 250° C., the partially-cured polyimide coating has a lower degree of adhesiveness as compared with the polyimide coating material cured at a temperature of 200–250° C.

Figure 1:
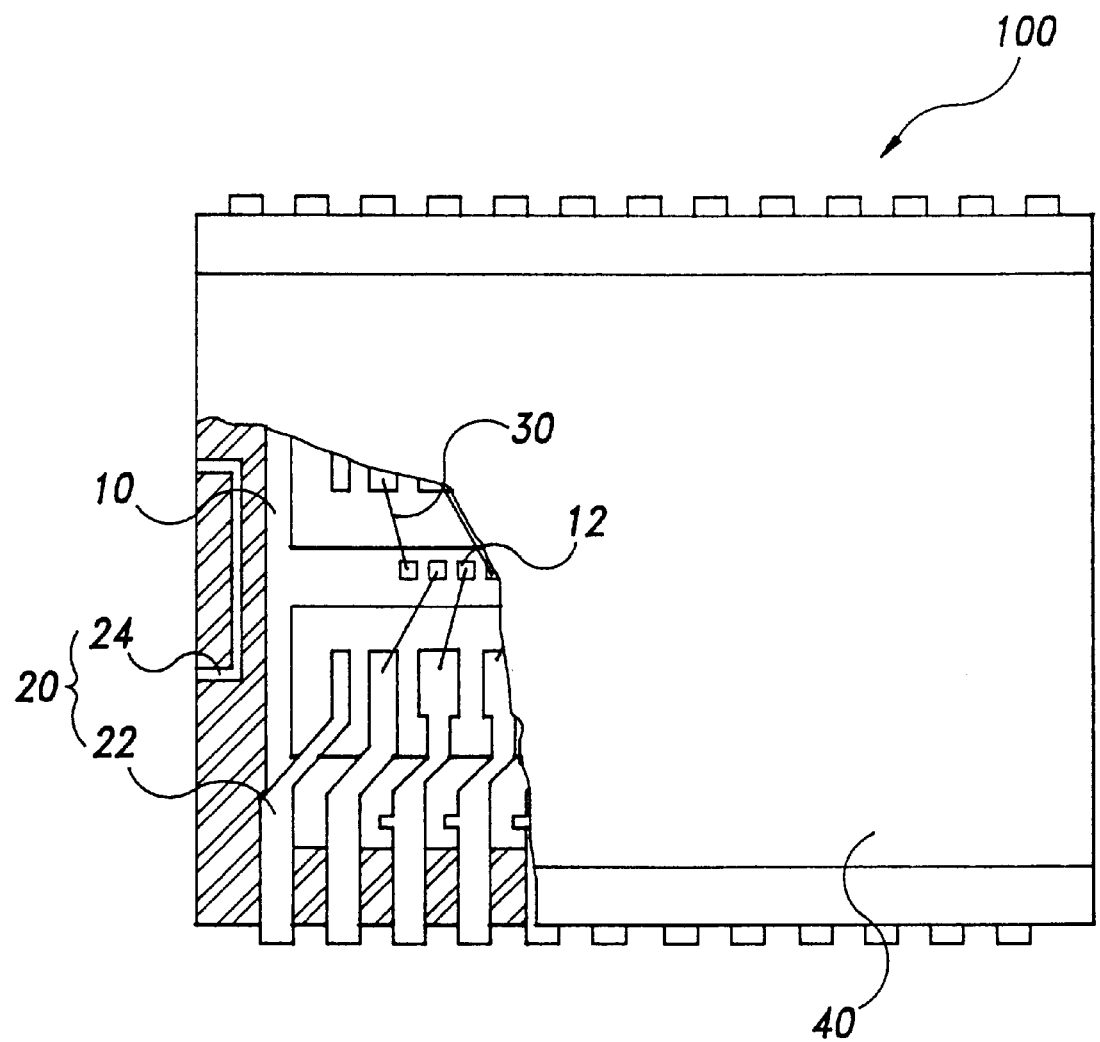
FIG. 1 is a partially broken away plan view showing a conventional LOC type semiconductor package.
Figure 2:
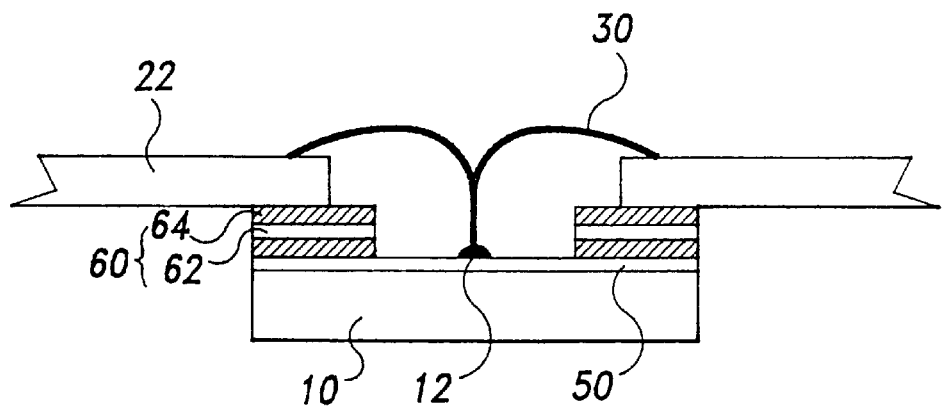
FIG. 2 is a cross-sectional view depicting the bonding of a semiconductor chip to a lead frame according to one embodiment of the conventional LOC type semiconductor package.
Figure 3:
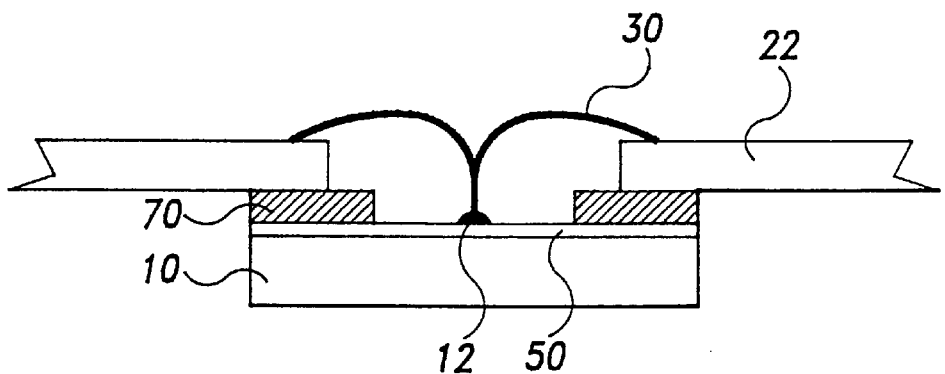
FIG. 3 is a cross-sectional view depicting the bonding of a semiconductor chip to a lead frame according to another embodiment of the conventional LOC type semiconductor package.

Leads 22 are bonded to single-sided polyimide tape 80 at on the lower surface of the leads. The single-sided polyimide tape 80 is cheaper than double-sided adhesive tape, like that shown in FIG. 2.

Next, the tape 80, which is now adhered to the leads 22, is bonded to the chip 10. A lead frame (of which lead 22 is a part) having single-sided polyimide tape 80 bonded thereto, is placed on the chip 10 in such a way that the non-adhesive side of the tape 80 is in contact with the partially-cured polyimide coating 50 on the chip 10. The lead frame is pressed using a conventional press, not shown, at a force in the range of 2–4 Kgf/cm$^2$ to attach the tape 80 to the chip 10. During this process, the lead frame is in contact with a heat plate having a temperature of 380–420° C.

Figure 5:
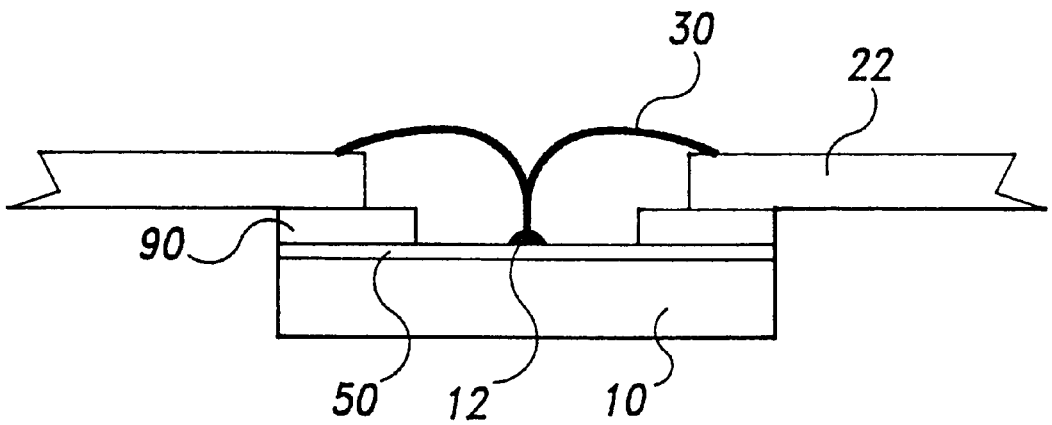
FIG. 5 is a cross-sectional view depicting the bonding of a semiconductor chip to a lead frame according to other embodiment of the inventive LOC type semiconductor package.

FIG. 5 is a cross-sectional view depicting the bonding of a semiconductor chip to a lead frame according to another embodiment of the inventive LOC type semiconductor package. Herein, a polyimide tape 90 is directly bonded to leads 22 without an adhesive agent. This bonding without using an adhesive agent can be accomplished by using a partially-cured polyimide to form tape 90. Polyimide film is cured at about 200–250° C. for about 0.5–1 hour to vaporize solvents to form a partially-cured polyimide tape 90. Although it is possible to cure the polyimide film at a temperature of 250° C. or above, the adhesion strength of the resulting polyimide tape is lower than the polyimide tape cured at a temperature of 200–250° C.

The resulting tape 90 is placed between leads 22 and chip 10, and pressure of 2–4 Kgf/cm$^2$ is applied. The chip 20 is on a heat plate, not shown, having a temperature 380–420° C. After that, the polyimide on the chip is cured at above 350° C. for above 1 hour. Alternatively, adhesive can be applied to the upper surface of partially-cured polyimide tape 90 to form a finished package similar to the view of FIG. 4.

According to the present invention, leads are bonded directly onto a semiconductor chip using a partially-cured polyimide coating on the upper surface of the chip so that the production cost can be reduced. Moreover, the number of interfaces between the leads and the chip is reduced so that the chip and package cracks can be significantly reduced since stress produced during the bonding of the tape to the chip.

Further, it is possible to apply an adhesive agent onto the non-adhesive side of the polyimide tape adhered to the leads so as for the tape to act as a double sided adhesive polyimide tape.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for bonding a semiconductor chip to a lead frame in a lead-on-chip (LOC) type semiconductor package in which a plurality of inner leads are bonded to an active surface of the semiconductor chip, said method comprising:
   preparing a semiconductor chip with a partially-cured polyimide coating on the active surface of the chip;
   attaching one side of a polyimide film to the inner leads;
   pressing the other side of the polyimide film against the polyimide coating on the active surface of the chip; and
   curing the coating.

2. The method of claim 1 wherein preparing a semiconductor chip with a partially-cured polyimide coating comprises curing an uncured polyimide layer for 0.5 to 1 hour at a temperature in the range of 200° C. to 250° C.

3. The method of claim 1 wherein pressing the other side of the polyimide film against the polyimide coating comprises applying pressure of 2–4 Kgf/cm$^2$ to the inner leads.

4. The method of claim 3 wherein pressing the other side of the polyimide film against the polyimide coating comprises pressing a tool against the inner leads and wherein said method further comprises heating the tool.

5. The method of claim 4 wherein heating the tool comprises heating the tool to a temperature in the range of 380° C. to 420° C.

6. The method of claim 1 wherein the polyimide film has an adhesive layer on one side thereof and wherein attaching one side of the polyimide film to the inner leads comprises urging the adhesive layer against the leads.

7. The method of claim 1 wherein the polyimide film is partially-cured and wherein said method further comprises curing the polyimide film after attaching one side of the polyimide film to the inner leads and pressing the other side of the polyimide film against the polyimide coating.

8. A method for bonding a semiconductor chip to a lead frame in a lead-on-chip (LOC) type semiconductor package in which a plurality of inner leads are bonded to an active surface of the semiconductor chip, said method comprising:
   preparing a partially-cured polyimide film;
   attaching one side of the polyimide film to the inner leads;
   pressing the other side of the polyimide film against a polyimide coating on the active surface of the chip; and
   curing the film.

9. The method of claim 8 wherein preparing a partially-cured polyimide film comprises curing an uncured polyimide layer for 0.5 to 1 hour at a temperature in the range of 200° C. to 250° C.

10. The method of claim 8 wherein pressing the other side of the polyimide film against the polyimide coating comprises applying pressure of 2–4 Kgf/cm$^2$ to the inner leads.

11. The method of claim 10 wherein pressing the other side of the polyimide film against the polyimide coating comprises pressing a tool against the inner leads and wherein said method further comprises heating the tool.

12. The method of claim 11 wherein heating the tool comprises heating the tool to a temperature in the range of 380° C. to 420° C.

13. The method of claim 8 wherein the polyimide film has an adhesive layer on one side thereof and wherein attaching one side of the polyimide film to the inner leads comprises urging the adhesive layer against the leads.

14. The method of claim 8 wherein the polyimide coating is partially-cured and wherein said method further comprises curing the polyimide coating after attaching one side of the polyimide film to the inner leads and pressing the other side of the polyimide film against the polyimide coating.

* * * * *